US007215585B2

(12) United States Patent  (10) Patent No.: US 7,215,585 B2
Lovett et al.  (45) Date of Patent: May 8, 2007

(54) METHOD AND APPARATUS FOR SYNCHRONIZING DATA FROM MEMORY ARRAYS

(75) Inventors: Simon J. Lovett, Boise, ID (US); Dean Gans, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/218,194

(22) Filed: Sep. 1, 2005

(65) Prior Publication Data

US 2007/0047376 A1    Mar. 1, 2007

(51) Int. Cl.
*G11C 7/00*    (2006.01)
(52) U.S. Cl. .................. 365/194; 365/205; 365/189.05; 365/233
(58) Field of Classification Search ........... 365/189.05, 365/205, 194, 233
See application file for complete search history.

(56) References Cited

U.S. PATENT DOCUMENTS 6,005,820 A * 12/1999 Imondi et al. ......... 365/230.01
6,130,843 A * 10/2000 Lee ..................... 365/189.05

* cited by examiner

*Primary Examiner*—Hoai V. Ho
(74) *Attorney, Agent, or Firm*—Jones Day; Edward L. Pencoske

(57) ABSTRACT

According to one embodiment, a combination is comprised of a plurality of sense amps, each having an input for receiving a clock signal. A data bus is for receiving data from the plurality of sense amps in response to a clock signal being input to the plurality of sense amps. A tracking circuit is responsive to the clock signal for producing a control signal. A plurality of latches is responsive to the control signal for latching data from the bus. The control signal has a delay that is equal to the time needed for a last data bit to arrive at the plurality of latches. That delay may be equal to a delay associated with inputting the clock signal to a last one of the plurality of sense amps, plus a delay of the last sense amp, plus a delay of the data bus. That amount of delay may be achieved in a number of ways which combines electrical delay with delay inherently associated with the tracking circuit's location. For example, the delay of the control signal may be achieved by locating the tracking circuit proximate to the last one of the plurality of sense amps and providing the tracking circuit with an electrical delay equal to the delay of the last one of the plurality of sense amps. Because of the rules governing abstracts, this abstract should not be used to construe the claims.

48 Claims, 4 Drawing Sheets

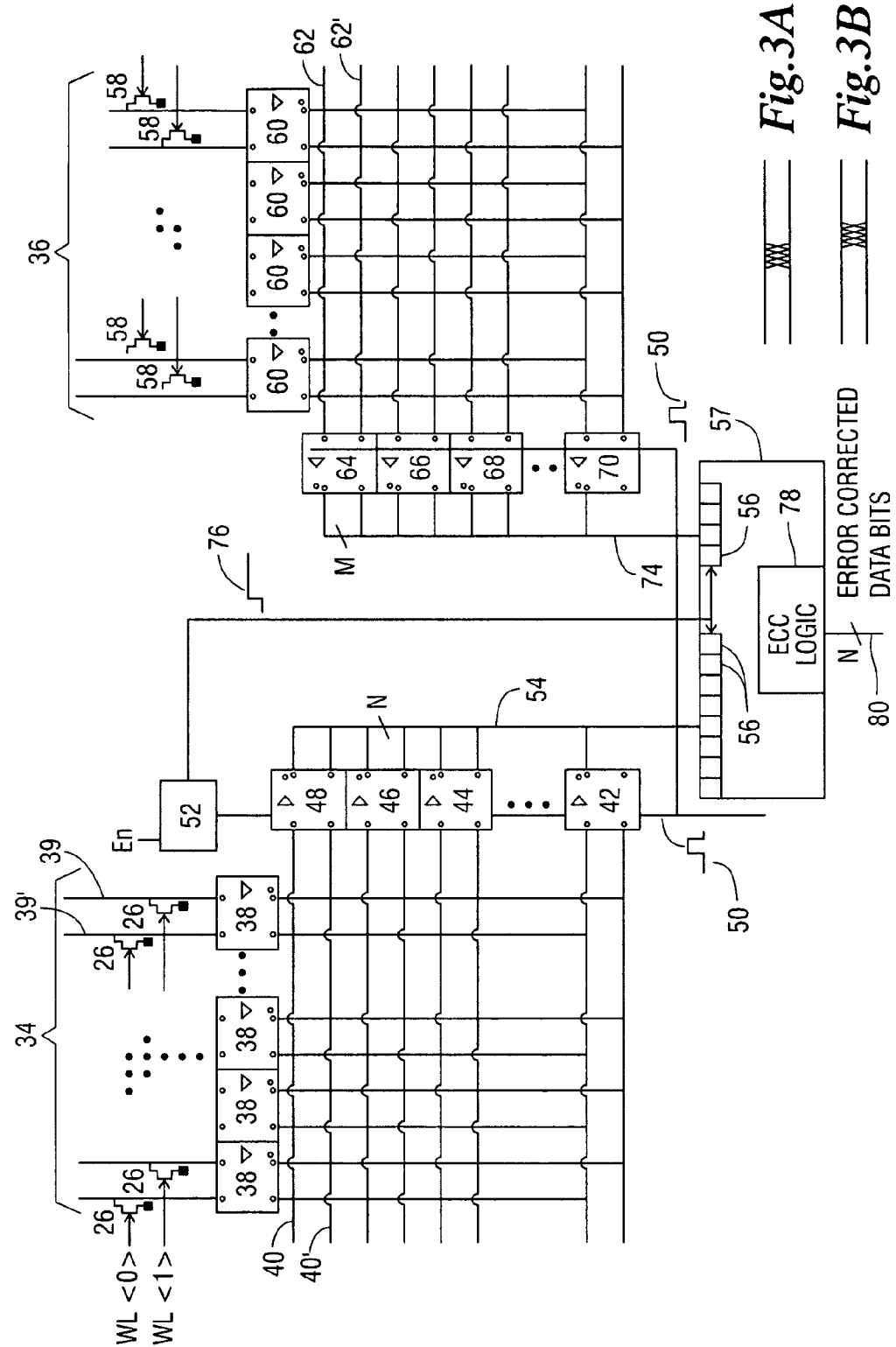

METHOD AND APPARATUS FOR SYNCHRONIZING DATA FROM MEMORY ARRAYS

BACKGROUND OF THE INVENTION

The present disclosure is directed to methods and devices for synchronizing data output from two or more memory arrays and, in one embodiment, for synchronizing data and error correction bits for optimum speed in a memory with on-die error correction.

Memory devices must perform error-detection to ensure that corrupted data is not output. The preferred protocols are referred to as ECC (Error Correction Code). ECC allows all single-bit errors in a data word to be corrected during analysis and certain multiple-bit errors to be detected and reported.

Currently, there are disadvantages to ECC. One of the disadvantages with ECC analysis in RAM (Random Access Memory) chips arises because of the time and energy needed to perform the ECC analysis. ECC requires two sets of data: the raw data to be corrected and the ECC data providing corrective information. ECC algorithms are more complicated than other error-detection methods, like parity checking, and the logic delays are longer. This causes an average of 2–3% decrease in performance in real world applications.

One of the problems with lost time and energy stems from aligning the bits for analysis. If the data is analyzed too soon, not all data bits may be present, and the analysis is not accurate. If the data is available for analysis, but not analyzed because some preset period of time has not elapsed, then power and time are wasted. In some prior art configurations, three separate signals are required to enable an ECC analysis, one to signal the data bus to send the raw data to the ECC block, another to signal the ECC bus to send the ECC data to the ECC block, and a third to enable the ECC block. Thus, each set of data must go through two enables before it is analyzed. This may create a situation where the data is not analyzed in a timely manner. Keeping the data in latches beyond when it is ready to be read wastes both time and the energy. Capacitors hold the data, but with leakage inherent over time, the data can also become too weak to read such that the data is no longer useful.

There is therefore a need to be able to analyze data as soon as the last bit, i.e. the slowest bit, of data is available to the ECC logic.

BRIEF SUMMARY OF THE INVENTION

According to one embodiment of the present disclosure, a combination is comprised of a plurality of sense amps, each having an input for receiving a clock signal. A data bus is for receiving data from the plurality of sense amps in response to a clock signal being input to the plurality of sense amps. A tracking circuit is responsive to the clock signal for producing a control signal. A plurality of latches is responsive to the control signal for latching data from the bus. The control signal has a delay that is equal to the time needed for the slowest bit of data, i.e. the last data bit of data, to arrive at the plurality of latches. That delay may be equal to a delay associated with inputting the clock signal to a last one of the plurality of sense amps, plus a delay of the last sense amp, plus a delay of the data bus. That amount of delay may be achieved in a number of ways which combines electrical delay with delay inherently associated with the tracking circuit's location. For example, the delay of the control signal may be achieved by locating the tracking circuit proximate to the last one of the plurality of sense amps and providing the tracking circuit with an electrical delay equal to the delay of the last one of the plurality of sense amps.

The disclosed combination may be used in various circuits such as, for example, in a memory device. When employed in a memory device, another embodiment of the present disclosure may include a first plurality of sense amps, each having an input for receiving a first clock signal, and a second plurality of sense amps, each having an input for receiving a second clock signal. A first data bus is for receiving data from the first plurality of sense amps in response to the first clock signal being input to the first plurality of sense amps. A second data bus is for receiving ECC data from the second plurality of sense amps in response to the second clock signal being input to the second plurality of sense amps. A tracking circuit is responsive to the first clock signal for producing a control signal. A plurality of latches is responsive to the control signal for latching data from the first and the second bus. The control signal has a delay that is equal to the time needed for a last data bit from the first data bus to arrive at the plurality of latches.

Methods of operation are also disclosed. In one embodiment, the method comprises inputting a clock signal to a first plurality of sense amps. Data is received, in response to the clock signal being input to the plurality of sense amps, on a data bus data from the first plurality of sense amps. A control signal is produce having a delay that is equal to the time needed for a last data bit to arrive at a plurality of latches. Data is latched from the data bus in response to the control signal.

Another method of operation comprises inputting a first clock signal to a first plurality of sense amps, each having a delay associated therewith. A second clock signal is input to a second plurality of sense amps, each having a delay associated therewith. Data is received on a first data bus from the first plurality of sense amps in response to the first clock signal. Data is received on a second data bus from the second plurality of sense amps in response to the second clock signal. A control signal is produced with a tracking circuit responsive to the first clock signal. The tracking circuit has a delay equal to the delay of one of the sense amps in the first plurality of sense amps. The tracking circuit is positioned proximate to a last one of the plurality of sense amps to receive the first clock signal. Data is latched from the first and second bus with a plurality of latches responsive to the control signal.

BRIEF DESCRIPTION OF THE DRAWINGS

For the present invention to be easily understood and readily practiced, the present invention will now be described, for purposes of illustration and not limitation, in conjunction with the following figures, wherein:

FIG. 2 illustrates a portion of the array and data path in which the method and apparatus of the present disclosure is implemented;

FIGS. 3A–3C illustrate timing diagrams helpful in understanding the present disclosure;

DETAILED DESCRIPTION OF THE INVENTION

Figure 1:
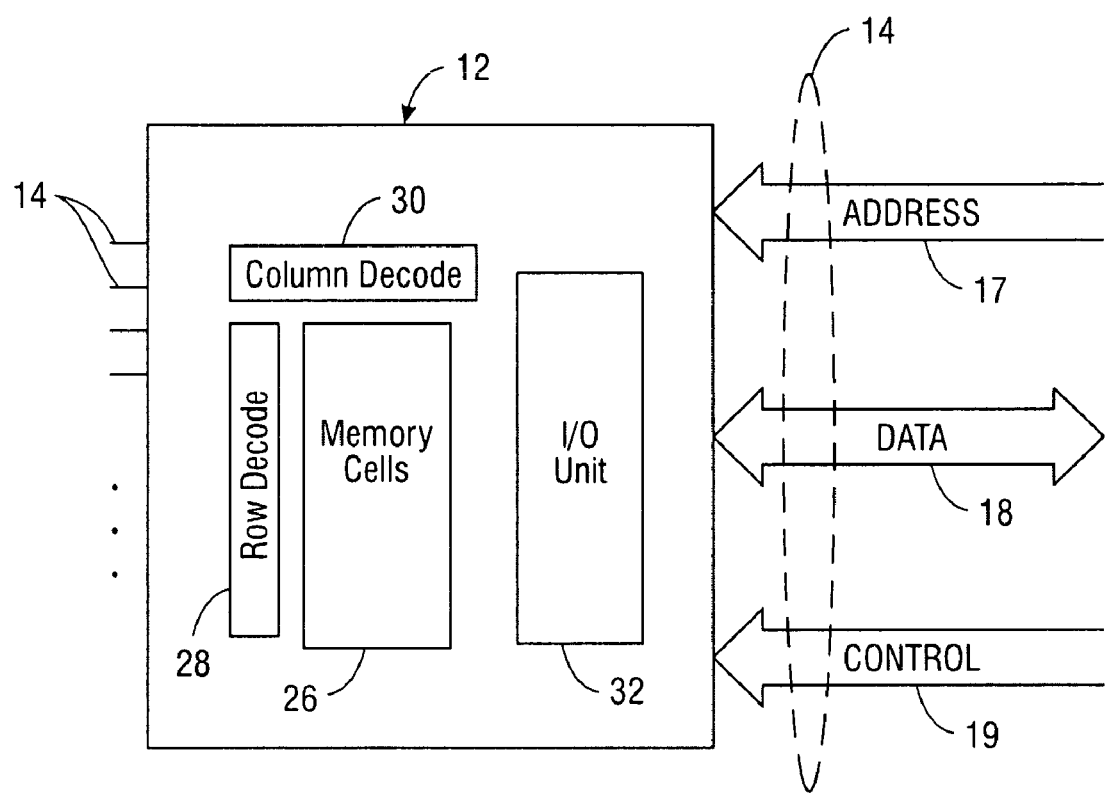
FIG. 1 illustrates an exemplary memory device in which the apparatus and method of the present disclosure may be used.

Memory devices are electronic devices that are widely used in many electronic products and computers to store data. A memory device is a semiconductor electronic device that includes a number of memory cells, each cell storing one bit of data. The data stored in the memory cells can be read during a read operation. FIG. 1 is a simplified block diagram showing a memory chip or memory device 12. The memory chip 12 may be part of a DIMM (dual in-line memory module) or a PCB (printed circuit board) containing many such memory chips (not shown in FIG. 1). The memory chip 12 may include a plurality of pins or ball contacts 14 located outside of chip 12 for electrically connecting the chip 12 to other system devices. Some of those pins 14 may constitute memory address pins or address bus 17, data (DQ) pins or data bus 18, and control pins or control bus 19. It is evident that each of the reference numerals 17–19 designates more than one pin in the corresponding bus. Further, it is understood that the schematic in FIG. 1 is for illustration only. That is, the pin arrangement or configuration in a typical memory chip may not be in the form shown in FIG. 1.

A processor or memory controller (not shown) may communicate with the chip 12 and perform memory read/write operations. The processor and the memory chip 12 may communicate using address signals on the address lines or address bus 17, data signals on the data lines or data bus 18, and control signals (e.g., a row address strobe (RAS), a column address strobe (CAS), a chip select (CS) signal, etc. (not shown)) on the control lines or control bus 19. The "width" (i.e., number of pins) of address, data and control buses may differ from one memory configuration to another.

Those of ordinary skill in the art will readily recognize that memory chip 12 of FIG. 1 is simplified to illustrate one embodiment of a memory chip and is not intended to be a detailed illustration of all of the features of a typical memory chip. Numerous peripheral devices or circuits may be typically provided along with the memory chip 12 for writing data to and reading data from the memory cells 26. However, these peripheral devices or circuits are not shown individually in FIG. 1 for the sake of clarity.

The memory chip 12 may include a plurality of memory cells 26 generally arranged in an array of rows and columns. A row decode circuit 28 and a column decode circuit 30 may select the rows and columns, respectively, in the array in response to decoding an address provided on the address bus 17. Data to/from the memory cells 26 are then transferred over the data bus 18 via sense amplifiers and a data output path (not shown in FIG. 1). A memory controller (not shown) may provide relevant control signals (not shown) on the control bus 19 to control data communication to and from the memory chip 12 via an I/O (input/output) circuit 32. The I/O circuit 32 may include a number of data output buffers or output drivers to receive the data bits from the memory cells 26 and provide those data bits or data signals to the corresponding data lines in the data bus 18. The I/O circuit 32 may also include various memory input buffers and control circuits that interact with the row and column decoders 28, 30, respectively, to select the memory cells for data read/write operations.

The memory controller (not shown) may determine the modes of operation of memory chip 12. Some examples of the input signals or control signals (not shown in FIG. 1) on the control bus 19 include an External Clock (CLK) signal, a Chip Select (CS) signal, a Row Address Strobe (RAS) signal, a Column Address Strobe (CAS) signal, a Write Enable (WE) signal, etc. The memory chip 12 communicates to other devices connected thereto via the pins 14 on the chip 12. These pins, as mentioned before, may be connected to appropriate address, data and control lines to carry out data transfer (i.e., data transmission and reception) operations.

FIG. 2 is a simplified block diagram depicting a portion of the memory device 12 of FIG. 1 in which the apparatus and method of the present disclosure may be used. In a preferred embodiment, two arrays are provided, a raw data array 34 and an ECC data array 36. The raw data array 34 may include the plurality of memory cells 26. A first array of sense amps 38 is responsive to the memory array 34. As is known, each sense amp 38 is responsive to a pair of digit lines 39, 39' for sensing information read from memory cells 26 or aiding in the writing of information to those memory cells 26 which have had their word line (WL) fired. The array of sense amps 38 outputs the sensed data to a plurality of shared differential input/output (I/O) lines 40, 40', typically through the use of multiplexers or other switching devices, not shown.

Data on the I/O line pairs 40,40' is sensed by a first plurality of DC sense amps 42, 44, 46, 48. The sense amps 42, 44, 46, 48 are responsive to a first clock signal 50 which propagates through the sense amps beginning with sense amp 42 and ending with sense amp 48. The first clock signal 50 is also input to a tracking circuit 52 located, in one embodiment, proximate to a last one of the sense amps, i.e. sense amp 48. Data sensed by the sense amps 42, 44, 46, 48 is output to a data bus 54. In a preferred embodiment, this data bus 54 is eight bits wide, i.e. N=8. A plurality of latches 56 in an ECC logic block 57 is provided such that there is one latch responsive to each bit on data bus 54 so that a data word can be latched (saved) for later processing.

In a preferred embodiment, the data array 36 may be used for ECC data and includes a plurality of ECC memory cells 58. As shown, the ECC data array 36 does not need to store as many bits as the raw data array 34. Typically, the ECC data will be four bits for each eight bit data word, making a total of a twelve bit codeword (data+ECC). An array of sense amps 60 is responsive to the ECC memory cells 58. This array of sense amps 60 outputs data onto shared differential I/O lines 62, 62'. A second plurality of sense amps 64, 66, 68, 70 is responsive to the data on I/O lines 62,62'. The second plurality of sense amps 64, 66, 68, 70 may be clocked by the first clock signal 50. The second plurality of sense amps 64, 66, 68, 70 outputs the ECC bits onto an ECC data bus 74. In a preferred embodiment, this data bus 74 is four bits wide, i.e. M=4. One of the latches 56 in the ECC logic block 59 is responsive to each bit on the ECC bus 74 so that a the ECC data can be latched (saved) for later processing.

In an alternative embodiment, the ECC data array may 36 may not be a physically distinct array as shown. Another alternative embodiment may include more than two data arrays (not shown) with separate clock signals for each The tracking circuit 52 produces a control signal 76. The control signal 76 acts as an enable for the plurality of latches 56 to begin the ECC analysis on the data from the data bus 54 and the ECC data bus 74. It is desirable to know when the last data bit is available to the plurality of latches 56 such that the latches can be enabled at an optimum time, neither too soon nor too late. In a preferred embodiment, the tracking circuit 52 is located proximate to the last sense amp 48 in the first plurality of sense amps. The theory for this location is that the data traveling from last sense amp 48 will have the longest delay of all the data traveling from both the first and the second pluralities of sense amps. By locating the tracking circuit 52 proximate to the last sense amp 48, the tracking circuit 52 will inherently have a delay associated with it that is substantially the same as the delay associated with the last sense amp 48. Constructing the tracking circuit 52 so that its electrical delay is substantially equal to the electrical delay of the last sense amp 48 ensures that control signal is produced and delivered to the latches 56 at an optimum time.

It can be seen that the delay of the data bit produced by the last sense amp 48 is comprised of a first delay associated with the propagation of the first clock signal 50 to the sense amp 48, a second delay associated with the electrical delay within the sense amp 48 itself, and a third delay associated with the time needed for the data to travel over data bus 54. By locating the tracking circuit 52 proximate to the last sense amp 48, the tracking circuit 52, by virtue of its position, mimics the first and third delays mentioned above. By designing the electrical delay of the tracking circuit 52 to be substantially the same as the electrical delay of the last sense amp 48, the control signal 76 can be produced and delivered at an optimal time.

Those of ordinary skill in the art will recognize that if the first and third delays are known, either through calculation or measurement, then the control circuit 52 can be positioned in a variety of locations so long as the delay associated with its location and its electrical delay are equivalent to the delay associated with the last sense amp 48. For example, the tracking circuit could be located proximate to the latches 56 such that the entire delay needed is produced electrically within the tracking circuit. Alternatively, the tracking circuit could be locate amongst the sense amps making up the first plurality of sense amps such that the delay associated therewith is a combination of the delay inherent from its location and its electrical delay.

FIGS. 3A–3C are helpful in understanding the operation of the circuit shown in FIG. 2. In FIG. 3A, the timing of the sensing of a data bit by the last sense amp 64 of the second plurality of sensing amps is illustrated. In FIG. 3B, the timing of the sensing of a data bit by the last sense amp 48 in the first plurality of sense amps is illustrated. FIG. 3C illustrates the timing of the production of the control signal 76 in relation to the sensing of the data bits illustrated in FIGS. 3A and 3B. It should be noted that although the first clock signal 50 is used to clock both sets of sense amps, separate signals could also be used.

The control signal 76 enables the latches 56 so that data may be latched from both the data bus 54 and the ECC bus 74. The raw data from the data bus 54 together with the error correction bits from the ECC bus 74 are input to ECC logic 78. The ECC logic 78 performs any conventional ECC algorithm so as to produce error corrected data bits which are available on a bus 80.

Figure 4:
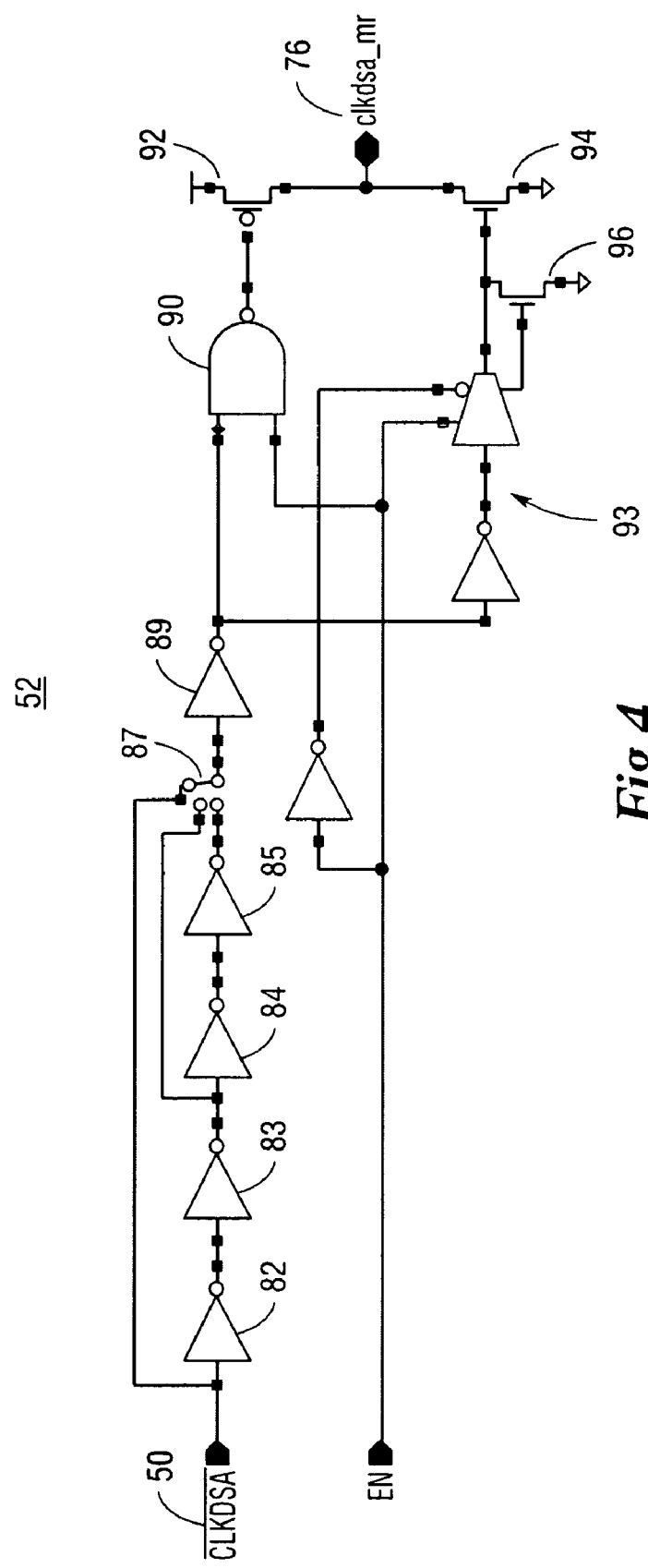
FIG. 4 illustrates one example of a tracking circuit.

Turning now to FIG. 4, FIG. 4 illustrates one example of a tracking circuit 52. The tracking circuit is comprised of a plurality of series connected delay circuits (e.g. inverters) 82, 83, 84, 85. The first delay circuit 82 receives the clock signal 50. A plurality of tap points is provided between the delay circuits with each tap point being responsive to a contact on a switch 87. By controlling the position of the switch 87, the amount of delay can be controlled.

An inverter 89 is responsive to switch 87. A logic gate 90 is responsive to the inverter 89 as well as an enable signal to control the operation of an output transistor 92 which produces the control signal 76. A circuit 93, in this embodiment an inverter and a multiplexer, are responsive to the inverter 89 and the enable signal to control the conduction of transistors 94 and 96. Those of ordinary skill in the art will recognize that the tracking circuit 52 illustrated in FIG. 4 is exemplary only in that many other designs for a tracking circuit may be implemented while remaining within the scope of the present disclosure.

Figure 5:
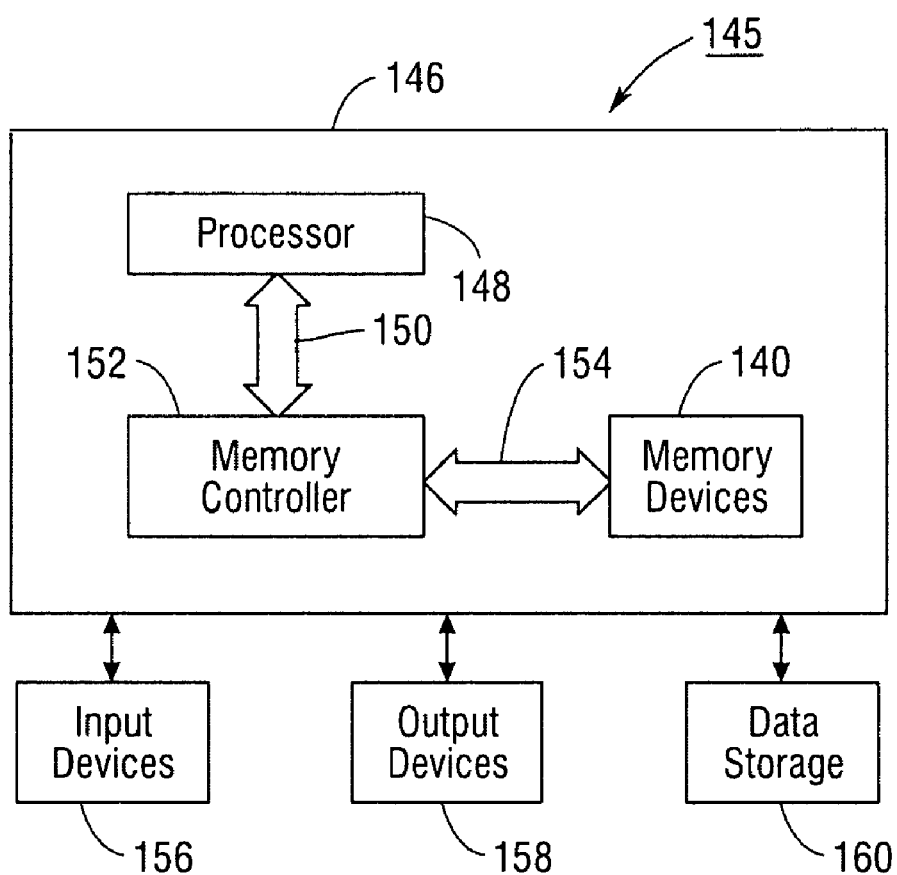
FIG. 5 illustrates a system in which the apparatus and method of the present disclosure may be used.

FIG. 5 is a block diagram depicting a system 145 in which one or more memory chips 140 illustrated in FIG. 1 may be used. The system 145 may include a data processing unit or computing unit 146 that includes a processor 148 for performing various computing functions, such as executing specific software to perform specific calculations or data processing tasks. The computing unit 146 also includes a memory controller 152 that is in communication with the processor 148 through a bus 150. The bus 150 may include an address bus (not shown), a data bus (not shown), and a control bus (not shown). The memory controller 152 is also in communication with a set of memory devices 140 (i.e., multiple memory chips 12 of the type shown in FIG. 1) through another bus 154 (which may be similar to the bus 14 shown in FIG. 1). Each memory device 140 may include appropriate data storage and retrieval circuitry, i.e. peripheral devices, as discussed above. The processor 148 can perform a plurality of functions based on information and data stored in the memories 140.

The memory controller 152 can be a microprocessor, digital signal processor, embedded processor, micro-controller, dedicated memory test chip, a tester platform, or the like, and may be implemented in hardware or software. The memory controller 152 may control routine data transfer operations to/from the memories 140, for example, when the memory devices 140 are part of an operational computing system 146. The memory controller 152 may reside on the same motherboard (not shown) as that carrying the memory chips 140. Various other configurations of electrical connection between the memory chips 140 and the memory controller 152 may be possible. For example, the memory controller 152 may be a remote entity communicating with the memory chips 140 via a data transfer or communications network (e.g., a LAN (local area network) of computing devices).

The system 145 may include one or more input devices 156 (e.g., a keyboard or a mouse) connected to the computing unit 146 to allow a user to manually input data, instructions, etc., to operate the computing unit 146. One or more output devices 158 connected to the computing unit 146 may also be provided as part of the system 145 to display or otherwise output data generated by the processor 148. Examples of output devices 158 include printers, video terminals or video display units (VDUs). In one embodiment, the system 145 also includes one or more data storage devices 160 connected to the data processing unit 146 to allow the processor 148 to store data in or retrieve data from internal or external storage media (not shown). Examples of typical data storage devices 160 include drives that accept hard and floppy disks, CD-ROMs (compact disk read-only memories), and tape cassettes.

While the present invention has been described in connection with preferred embodiments thereof, those of ordinary skill in the art will recognize that many modifications and variations are possible. The present invention is intended to be limited only by the following claims and not by the foregoing description which is intended to set forth the presently preferred embodiment.

What is claimed is:

1. A combination, comprising:
   a plurality of sense amps, each having an input for receiving a clock signal;
   a data bus for receiving data from said plurality of sense amps in response to said clock signal being input to said plurality of sense amps;
   a tracking circuit responsive to said clock signal for producing a control signal; and
   a plurality of latches responsive to said control signal for latching data from said bus, and
   wherein said control signal has a delay that is equal to the time needed for a last data bit to arrive at said plurality of latches.

2. The combination of claim 1 wherein said delay of said control signal is equal to a delay associated with inputting said clock signal to a last one of said plurality of sense amps, plus a delay of said last sense amp, plus a delay of said data bus.

3. The combination of claim 2 wherein said delay of said control signal is achieved through a combination of electrical delay and tracking circuit location.

4. The combination of claim 3 wherein said delay of said control signal is achieved by locating said tracking circuit proximate to said last one of said plurality of sense amps and providing said tracking circuit with an electrical delay equal to the delay of said last one of said plurality of sense amps.

5. A circuit for synchronizing the latching of data comprising a plurality of sense amps for sensing said data and for outputting said data onto a data bus in response to a clock signal, a plurality of latches responsive to the data on the data bus, the improvement comprising a tracking circuit for producing a control signal for controlling said plurality of latches, wherein said control signal has a delay that is equal to the time needed for a last data bit to arrive at said plurality of latches.

6. The circuit of claim 5 wherein said delay of said control signal is equal to a delay associated with inputting said clock signal to a last one of said plurality of sense amps, plus a delay of said last sense amp, plus a delay of said data bus.

7. The circuit of claim 6 wherein said delay of said control signal is achieved through a combination of electrical delay and tracking circuit location.

8. The circuit of claim 7 wherein said delay of said control signal is achieved by locating said tracking circuit proximate to said last one of said plurality of sense amps and providing said tracking circuit with an electrical delay equal to the delay of said last one of said plurality of sense amps.

9. A combination, comprising:
   a first plurality of sense amps, each having an input for receiving a first clock signal;
   a second plurality of sense amps, each having an input for receiving a second clock signal;
   a first data bus for receiving data from said first plurality of sense amps in response to said first clock signal being input to said first plurality of sense amps;
   a second data bus for receiving data from said second plurality of sense amps in response to said second clock signal being input to said second plurality of sense amps;
   a tracking circuit responsive to one of said first and second clock signals for producing a control signal; and
   a plurality of latches responsive to said control signal for latching data from said first and said second bus, and
   wherein said control signal has a delay that is equal to the time needed for a last data bit from either said first or second data bus to arrive at said plurality of latches.

10. The combination of claim 9 wherein said first plurality of sense amps is responsive to data in a first memory array and wherein said second plurality of sense amps is responsive to error correction code data in a second memory array.

11. The combination of claim 10 wherein said delay of said control signal is equal to a delay associated with inputting one of said first and second clock signals to a last one of said first plurality and second plurality of sense amps, respectively, plus a delay of said last sense amp, plus a delay of said first and said second data bus, respectively.

12. The combination of claim 11 wherein said delay of said control signal is achieved through a combination of electrical delay and tracking circuit location.

13. The combination of claim 12 wherein said delay of said control signal is achieved by locating said tracking circuit proximate to a last one of said first and said second plurality of sense amps and providing said tracking circuit with an electrical delay equal to the delay of said last one of either said first or said second plurality of sense amps.

14. A method, comprising:
   inputting a clock signal to a first plurality of sense amps;
   receiving, in response to said clock signal being input to said plurality of sense amps, data on a data bus data from said first plurality of sense amps;
   producing a control signal having a delay that is equal to the time needed for a last data bit to arrive at a plurality of latches; and
   latching data from said data bus in response to said control signal.

15. The method of claim 14 wherein said delay of said control signal is equal to a delay associated with inputting said clock signal to a last one of said plurality of sense amps, plus a delay associated with said amp, plus a delay associated with said bus.

16. The method of claim 15 wherein said delay of said control signal is achieved through a combination of electrical delay and tracking circuit location.

17. The method of claim 16 wherein said delay of said control signal is achieved by locating said tracking circuit proximate to said last one of said plurality of sense amps and providing said tracking circuit with an electrical delay equal to the delay of said last one of said plurality of sense amps.

18. A method for synchronizing the latching of data comprising sensing said data with a plurality of sense amps and outputting said sensed data onto a data bus in response to a clock signal, latching said data from said data bus in response to a control signal, the improvement comprising producing a control signal for controlling said plurality of latches, wherein said control signal has a delay that is equal to the time needed for a last data bit to arrive at said plurality of latches.

19. The method of claim 18 wherein said delay of said control signal is equal to a delay associated with inputting said clock signal to a last one of said plurality of sense amps, plus a delay of said last sense amp, plus a delay of said data bus.

20. The method of claim 19 wherein said delay of said control signal is achieved through a combination of electrical delay and tracking circuit location.

21. The method of claim 20 wherein said delay of said control signal is achieved by locating said tracking circuit proximate to said last one of said plurality of sense amps and providing said tracking circuit with an electrical delay equal to the delay of said last one of said plurality of sense amps.

22. A method, comprising:
   inputting a first clock signal to a first plurality of sense amps;

inputting a second clock signal to a second plurality of sense amps;

receiving data on a first data bus from said first plurality of sense amps in response to said first clock signal being input to said first plurality of sense amps;

receiving data on a second data bus from said second plurality of sense amps in response to said second clock signal being input to said second plurality of sense amps;

producing a control signal with a tracking circuit responsive to one of said first and second clock signals; and latching data from said first and said second bus with a plurality of latches responsive to said control signal, and wherein said control signal has a delay that is equal to the time needed for a last data bit from either said first or second data bus to arrive at said plurality of latches.

23. The method of claim 22 wherein said first plurality of sense amps is responsive to data in a first memory array and wherein said second plurality of sense amps is responsive to error correction code data in a second memory array.

24. The method of claim 23 wherein said delay of said control signal is equal to a delay associated with inputting one of said first and second clock signals to a last one of said first plurality and second plurality of sense amps, respectively, plus a delay of said last sense amp, plus a delay of said first and said second data bus, respectively.

25. The method of claim 24 wherein said delay of said control signal is achieved through a combination of electrical delay and tracking circuit location.

26. The method of claim 25 wherein said delay of said control signal is achieved by locating said tracking circuit proximate to a last one of said first and said second plurality of sense amps and providing said tracking circuit with an electrical delay equal to the delay of said last one of either said first or said second plurality of sense amps.

27. A memory device, comprising:
a plurality of data cells arranged into rows and columns; and
a plurality of peripheral devices for reading data from said data cells, said plurality of peripheral devices comprising:
 a plurality of sense amps, each having an input for receiving a clock signal;
 a data bus for receiving data from said plurality of sense amps in response to said clock signal being input to said plurality of sense amps;
 a tracking circuit responsive to said clock signal for producing a control signal; and
 a plurality of latches responsive to said control signal for latching data from said bus, and
 wherein said control signal has a delay that is equal to the time needed for a last data bit to arrive at said plurality of latches.

28. The device of claim 27 wherein said delay of said control signal is equal to a delay associated with inputting said clock signal to a last one of said plurality of sense amps, plus a delay of said last sense amp, plus a delay of said data bus.

29. The device of claim 28 wherein said delay of said control signal is achieved through a combination of electrical delay and tracking circuit location.

30. The device of claim 29 wherein said delay of said control signal is achieved by locating said tracking circuit proximate to said last one of said plurality of sense amps and providing said tracking circuit with an electrical delay equal to the delay of said last one of said plurality of sense amps.

31. A memory device having a plurality of cells arranged into rows and columns and a plurality of peripheral devices for reading data into and reading data out of said plurality of peripheral devices, said peripheral devices comprising a circuit for synchronizing the latching of data comprising a plurality of sense amps for sensing said data and for outputting said data onto a data bus in response to a clock signal, a plurality of latches responsive to the data on the data bus, the improvement comprising a tracking circuit for producing a control signal for controlling said plurality of latches, wherein said control signal has a delay that is equal to the time needed for a last data bit to arrive at said plurality of latches.

32. The device of claim 31 wherein said delay of said control signal is equal to a delay associated with inputting said clock signal to a last one of said plurality of sense amps, plus a delay of said last sense amp, plus a delay of said data bus.

33. The device of claim 32 wherein said delay of said control signal is achieved through a combination of electrical delay and tracking circuit location.

34. The device of claim 33 wherein said delay of said control signal is achieved by locating said tracking circuit proximate to said last one of said plurality of sense amps and providing said tracking circuit with an electrical delay equal to the delay of said last one of said plurality of sense amps.

35. A memory device, comprising:
a plurality of data cells arranged into rows and columns; and
a plurality of peripheral devices for reading data from said data cells, said plurality of peripheral devices comprising:
 a first plurality of sense amps, each having an input for receiving a first clock signal;
 a second plurality of sense amps, each having an input for receiving a second clock signal;
 a first data bus for receiving data from said first plurality of sense amps in response to said first clock signal being input to said first plurality of sense amps;
 a second data bus for receiving data from said second plurality of sense amps in response to said second clock signal being input to said second plurality of sense amps;
 a tracking circuit responsive to one of said first and second clock signals for producing a control signal; and
 a plurality of latches responsive to said control signal for latching data from said first and said second bus, and
 wherein said control signal has a delay that is equal to the time needed for a last data bit from either said first or second data bus to arrive at said plurality of latches.

36. The device of claim 35 wherein said plurality of data cells is arranged into a first memory array and a second memory array, and wherein said first plurality of sense amps is responsive to data in said first memory array and wherein said second plurality of sense amps is responsive to error correction code data in said second memory array.

37. The device of claim 36 wherein said delay of said control signal is equal to a delay associated with inputting one of said first and second clock signals to a last one of said first plurality and second plurality of sense amps, respectively, plus a delay of said last sense amp, plus a delay of said first and said second data bus, respectively.

38. The device of claim 37 wherein said delay of said control signal is achieved through a combination of electrical delay and tracking circuit location.

39. The device of claim 38 wherein said delay of said control signal is achieved by locating said tracking circuit proximate to a last one of said first and said second plurality of sense amps and providing said tracking circuit with an electrical delay equal to the delay of said last one of either said first or said second plurality of sense amps.

40. A system having a processor, a memory device, and a bus for interconnecting said processor and said memory device, said memory device having a plurality of cells arranged into rows and columns and a plurality of peripheral devices for reading data into and reading data out of said plurality of peripheral devices, said peripheral devices comprising a circuit for synchronizing the latching of data comprising a plurality of sense amps for sensing said data and for outputting said data onto a data bus in response to a clock signal, a plurality of latches responsive to the data on the data bus, the improvement comprising a tracking circuit for producing a control signal for controlling said plurality of latches, wherein said control signal has a delay that is equal to the time needed for a last data bit to arrive at said plurality of latches.

41. The system of claim 40 wherein said delay of said control signal is equal to a delay associated with inputting said clock signal to a last one of said plurality of sense amps, plus a delay of said last sense amp, plus a delay of said data bus.

42. The system of claim 41 wherein said delay of said control signal is achieved through a combination of electrical delay and tracking circuit location.

43. The system of claim 42 wherein said delay of said control signal is achieved by locating said tracking circuit proximate to said last one of said plurality of sense amps and providing said tracking circuit with an electrical delay equal to the delay of said last one of said plurality of sense amps.

44. A system, comprising;
 a processor;
 a memory device; and
 a bus for interconnecting said processor and said memory device, said memory device, comprising:
  a plurality of data cells arranged into rows and columns; and
  a plurality of peripheral devices for reading data from said data cells, said plurality of peripheral devices comprising:
   a first plurality of sense amps, each having an input for receiving a first clock signal;
   a second plurality of sense amps, each having an input for receiving a second clock signal;
   a first data bus for receiving data from said first plurality of sense amps in response to said first clock signal being input to said first plurality of sense amps;
   a second data bus for receiving data from said second plurality of sense amps in response to said second clock signal being input to said second plurality of sense amps;
   a tracking circuit responsive to one of said first and second clock signals for producing a control signal; and
   a plurality of latches responsive to said control signal for latching data from said first and said second bus, and
   wherein said control signal has a delay that is equal to the time needed for a last data bit from either said first or second data bus to arrive at said plurality of latches.

45. The system of claim of claim 44 wherein said plurality of data cells is arranged into a first memory array and a second memory array, and wherein said first plurality of sense amps is responsive to data in said first memory array and wherein said second plurality of sense amps is responsive to error correction code data in said second memory array.

46. The system of claim 45 wherein said delay of said control signal is equal to a delay associated with inputting one of said first and second clock signals to a last one of said first plurality and second plurality of sense amps, respectively, plus a delay of said last sense amp, plus a delay of said first and said second data bus, respectively.

47. The system of claim 46 wherein said delay of said control signal is achieved through a combination of electrical delay and tracking circuit location.

48. The system of claim 47 wherein said delay of said control signal is achieved by locating said tracking circuit proximate to a last one of said first and said second plurality of sense amps and providing said tracking circuit with an electrical delay equal to the delay of said last one of either said first or said second plurality of sense amps.

* * * * *